(12) United States Patent
Shubat (10) Patent No.: US 6,269,036 B1
(45) Date of Patent: Jul. 31, 2001

(54) SYSTEM AND METHOD FOR TESTING MULTIPLE PORT MEMORY DEVICES

(75) Inventor: Alexander Shubat, Fremont, CA (US)

(73) Assignee: Virage Logic Corporation, Fremont, CA (US)

( * ) Notice: Subject to any disclaimer, the term of this patent is extended or adjusted under 35 U.S.C. 154(b) by 0 days.

(21) Appl. No.: 09/439,837

(22) Filed: Nov. 12, 1999

(51) Int. Cl.[7] ........................................ G11C 7/00
(52) U.S. Cl. ..................... 365/201; 365/203; 365/230.05
(58) Field of Search .............................. 365/201, 230.03, 365/203, 230.05

(56) References Cited

U.S. PATENT DOCUMENTS

| | | | |
|---|---|---|---|
| 5,432,747 | * 7/1995 | Fuller et al. | 365/203 |
| 5,541,887 | * 7/1996 | Dhong et al. | 365/230.05 |
| 5,590,087 | * 12/1996 | Chung et al. | 365/230.05 |
| 5,815,456 | * 9/1998 | Rao | 365/230.03 |
| 5,956,288 | * 9/1999 | Bermingham et al. | 365/230.06 |

\* cited by examiner

Primary Examiner—Richard Elms
Assistant Examiner—Hien Nguyen
(74) Attorney, Agent, or Firm—Fenwick & West LLP (57) ABSTRACT

The multiple-port memory device preferably comprises a first and second control logic having test circuitry. The first and second control logic are preferably adapted to receive both the clock signal and a test signal. The first and second control logic includes a clock control circuit that produces a clock signal (CCLK) that is used by other portions of the first and second control logic to assert the word lines. The clock control circuit also produces a control signal (EQ) that is used to control pre-charging transistor that form the first and second input/output circuits. The clock control circuit is particularly advantageous because it uses the test signal as an alternate control to activate the precharge circuits as desired for testing. Therefore, the present invention provides for direct control of portions of the memory array to allow the memory array to be tested under the most stressful conditions.

19 Claims, 11 Drawing Sheets

SYSTEM AND METHOD FOR TESTING MULTIPLE PORT MEMORY DEVICES

BACKGROUND OF THE INVENTION

1. Field of the Invention

This invention relates generally to the field of memory logic devices and more specifically to systems and method for testing memory devices. More particularly, the present invention relates to memory arrays that include circuitry for testing multiple port memory arrays.

2. Description of the Background Art

Memory devices are well known in the semiconductor industry. The integration of memory cores with other circuitry has increased dramatically because of the proliferation and popularity of Application Specific Integrated Circuits (ASIC). New and improved designs for memory arrays such for system on a chip have increased the demand for shorter access times and greater word sizes. Since the memory cores are now integrated with other circuitry, a faulty memory core causes the entire chip to be defective and worthless. Thus, there is a need for a more reliable system and method for testing memory devices and protecting against such failures.

One prior art approach is to include circuitry for testing the memory as part of the memory device itself. This circuitry is used once for testing when the chip is fabricated, and then remains unused during normal operation of the memory device. Thus, it is preferred to minimize the area required for such testing circuitry. Furthermore, new memory arrays have ever-decreasing size and power requirements. For example, new uses for ASICs such as cellular telephones, portable computers, and hand held devices require new memory arrays that are more powerful, yet require less circuit area to implement and consume less power for increased battery life. Therefore, the space available for providing circuitry for testing the memory array on the integrated circuit itself is severely limited. Thus, there is very little excess area to provide circuitry for testing of the memory device as part of the integrated circuit.

Figure 1:
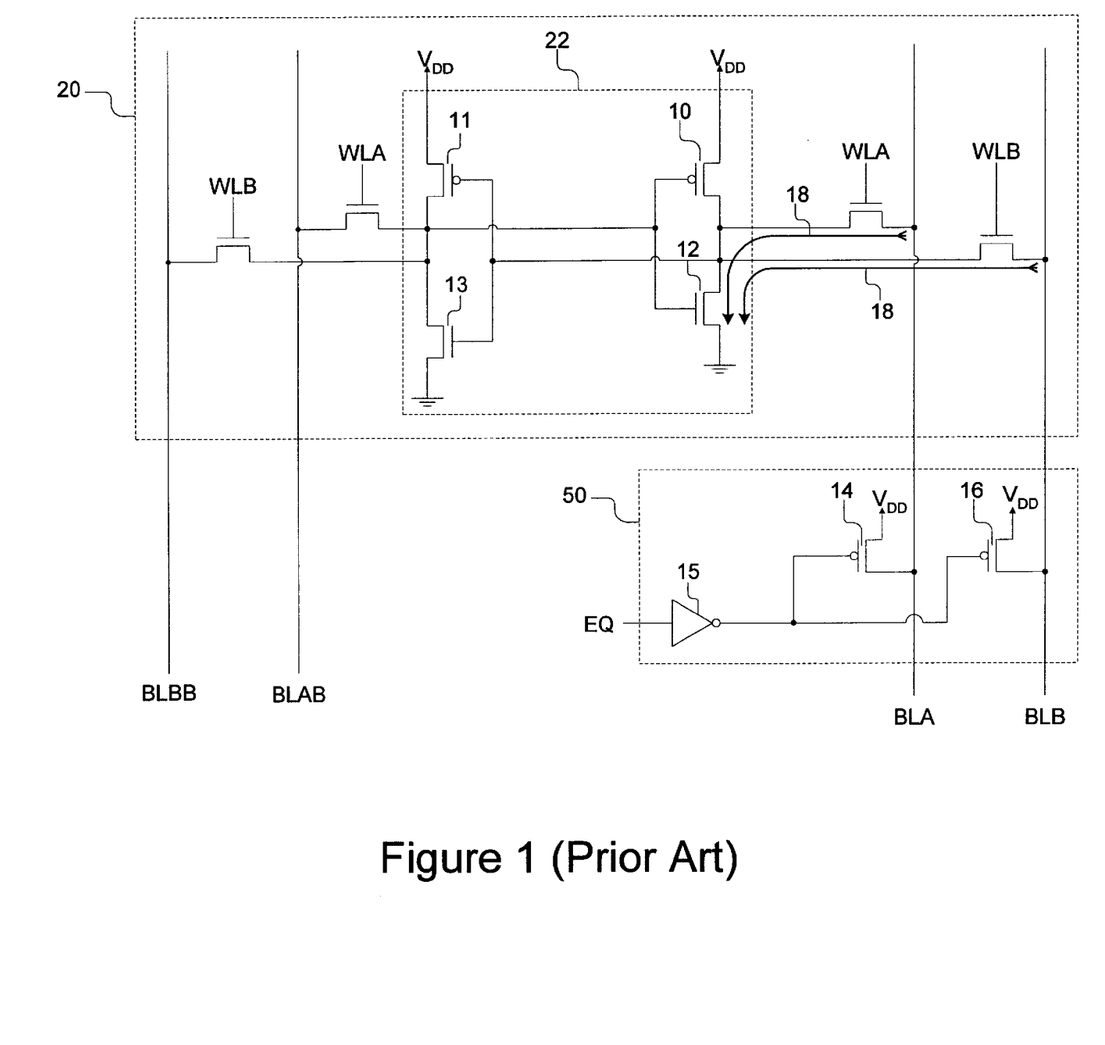
FIG. 1 is a circuit diagram of a portion of a prior art memory array showing a first case of portions of the circuit likely to fail if not properly tested.

Multiple port memory devices pose a particular problem for adequate and accurate testing. Because of the multiple ports, there are certain conditions or states for a multiple port memory device that place additional stress on the integrated circuit, and are therefore, more likely to cause failure. One particular situation is shown in FIG. 1. FIG. 1 illustrates part of a prior art memory array 20 showing portions of the circuit likely to fail if not properly tested. A exemplary memory cell 22 formed from a pairs of transistors 10, 11, 12, 13 and its coupling to word lines WLA, WLB and bit lines BLA, BLB, BLAB, BLBB are shown. FIG. 1 also illustrates relevant portions of a pre-chargeing circuit 50 that include pre-charging transistors 14, 16 for the respective bit lines BLA, BLB and an input control line coupled to inverter 15. The pre-charging transistors 14, 16 are controlled by a control signal, EQ. In normal operation, the memory cell 22 will have the one word line, WLA, active and the other word line, WLB, inactive (or vice versa). Standard operation of the memory cell 22 will test such a case, and the read current (≈200 µA shown as line 18) will be sufficient for the sense amplifiers to operate correctly, thus the memory device will be operational. However, a more significant case, and a case where the transistor 12 forming the cell 22 undergoes more significant stress is where both the word lines WLA, WLB are active. In this case, the read current is reduced to approximately (≈150 µA) because it is distributed over two bit lines. This current may be insufficient to allow the sense amplifier to operate properly, and thus, the memory cell 22 will be defective in such instances. This is a worse case test for the memory cells 22 that often goes untested, because the controller typically has no way to assert both the word lines WLA, WLB simultaneously. In the normal case, it is difficult to have both word lines active simultaneously or to guarantee that that both word lines will be enabled at the same time during normal mode to allow worst case testing. Thus, there is a need for a system and method that can properly test and detect circuit failures of this type.

Another concern when both lines are pre-charged and providing current is the effect on reliability of circuit. If the current is increased and the circuit has not been properly constructed or processed, then a contact may fail such as due to a break in the metal layer. There are sometimes defects in the integrated circuit that will operate properly under normal conditions, however, under stressful conditions a contact or metal line will break. Such defects remain in the chip and will not be detected until after the chips are shipped. Later during normal operations, the defects will be revealed due to clock skew or accessing both WLA and WLB simultaneously.

Figure 2:
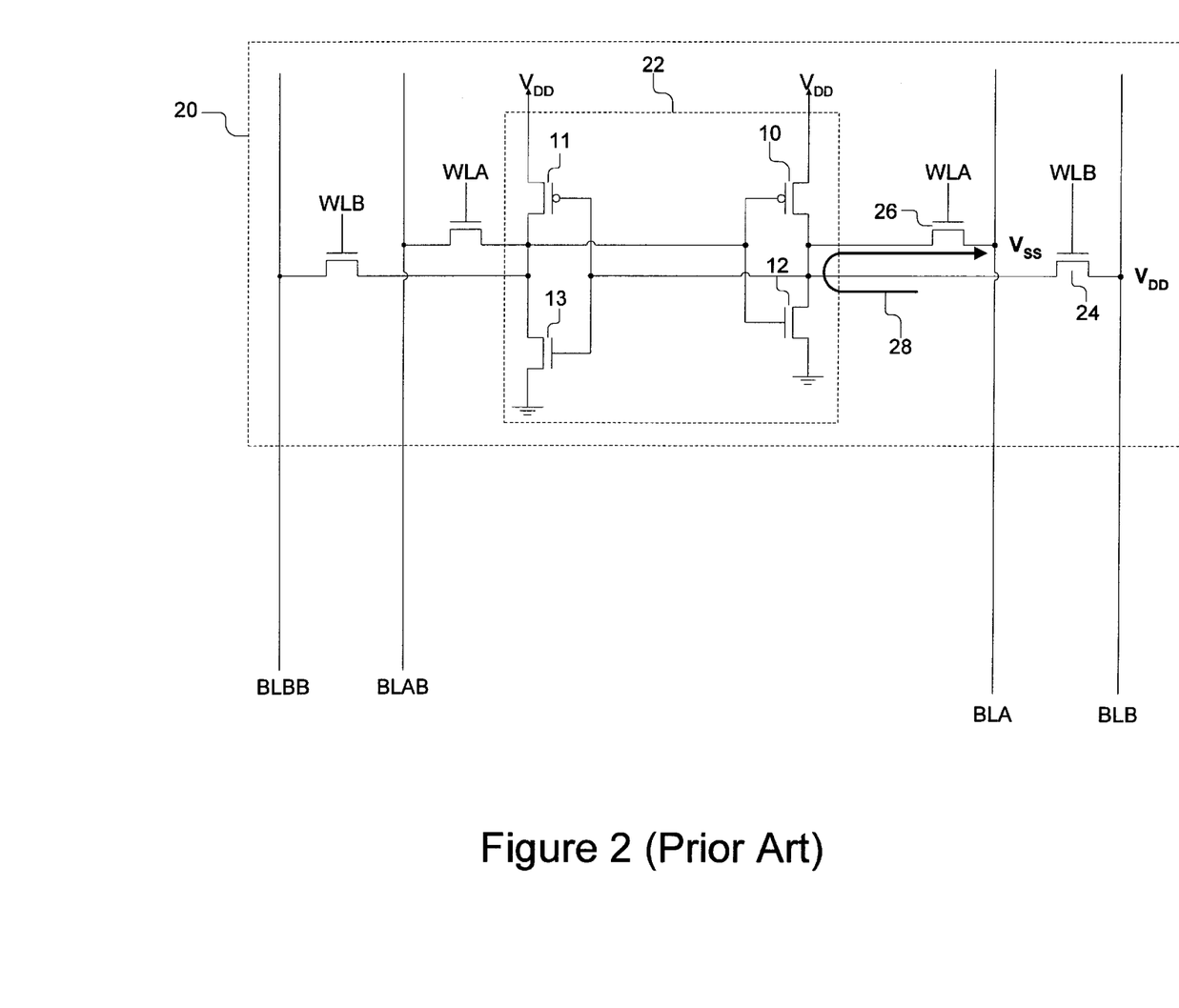
FIG. 2 is a circuit diagram of a portion of a prior art memory array showing a second case of portions of the circuit likely to fail if not properly tested.

Referring now to FIG. 2, yet another part of a prior art memory array 20 showing other portions of the circuit likely to fail is shown. For ease of understanding and convenience, FIG. 2 illustrates only the relevant portions of FIG. 1. The memory cell 22 is coupled to respective word line transistors 24, 26. In certain instances, the word line WLA may be active in reading the line and word line WLB may be active in writing the line. In such a case the path for the current indicated by arrow 28. This places additional stress on the transistors 10, 12 because the line must sink the current from both word lines WLA, WLB. Furthermore, when word line WLA is trying to write, the current from the pre-charging of WLB for read may be too strong and writing to WLA may not work (e.g., may not exceed the necessary threshold). This shows another area where the memory cells 22 of the prior art are not tested.

Figure 3:
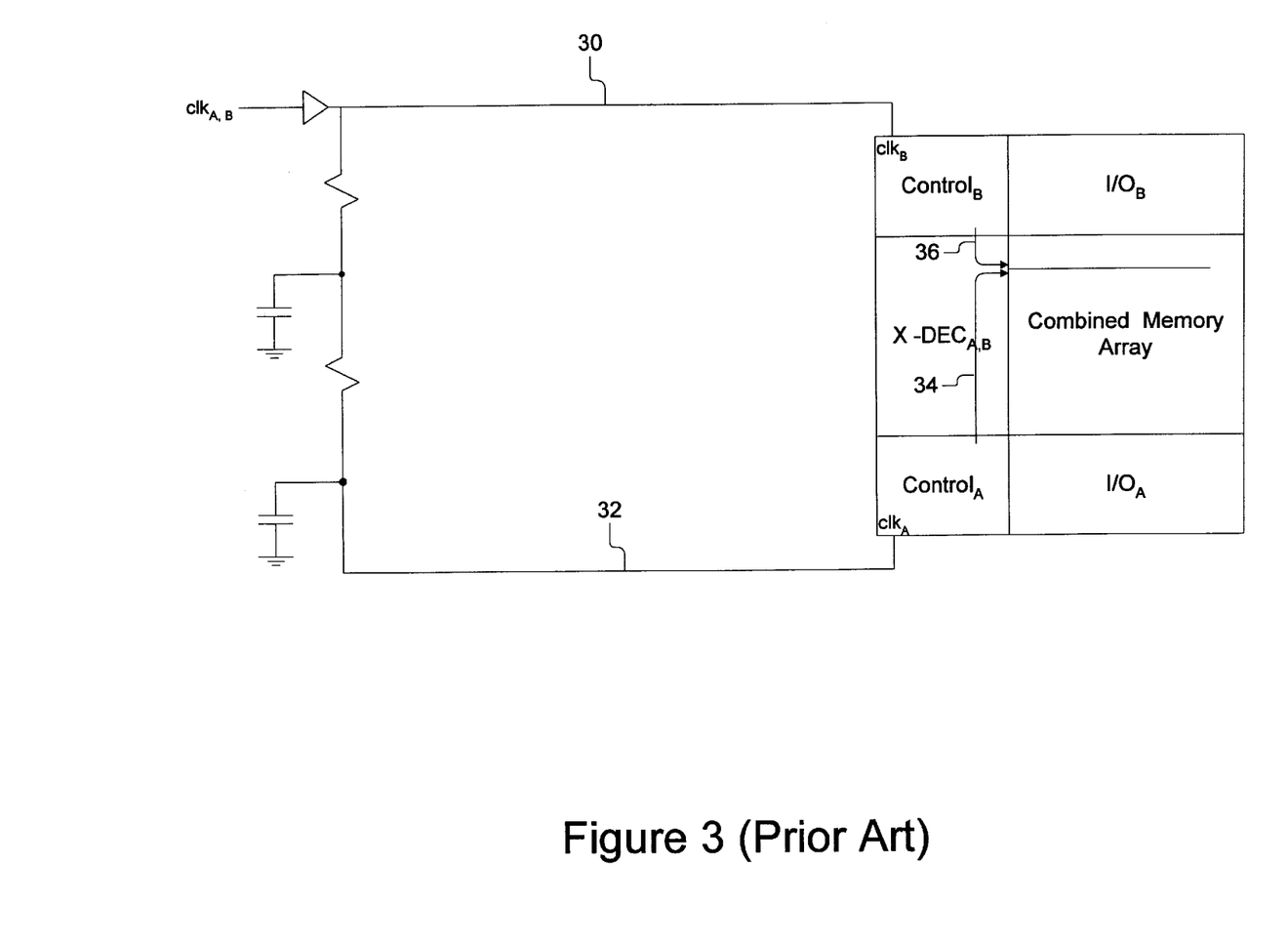
FIG. 3 is a partial block diagram of a multiple port memory module of the prior art illustrating clock skew that affects testing of the memory module.

As noted above, one common problem with existing memory cores is that these circumstances discussed above with reference to FIGS. 1 and 2 often are brought into existence because of clock skew. FIG. 3 illustrates how skew of the clock signals used in the memory core can occur. While FIG. 3 describes a particular example where the $clk_A$ input and the $clk_B$ input of the circuit receive the same clock signal even though it is skewed by the time it reaches these inputs, the presence of clock skew applies equally if not more for situations where the $clk_A$ input and the $clk_B$ input receive different clock signals. First, there is clock skew internal to the memory core as shown by lines 34, 36 since lengths of the word lines will be different due to the position of the respective control, pre-decoding and X-decoding logic. Thus, depend on your position in the memory, the clock skew may differ dramatically. Second, there will be external skew. Since each control portion of the core, $Control_A$, $Control_B$, has its own clock signal $clk_A$, $clk_B$ that has a different path 30, 32 and must traverse different portions of the circuit. Thus, the clock skew of a core will also vary radically depending on the other circuitry to which the memory core is coupled and the different paths that the clock signal must traverse. Therefore, the memory core if not tested for the condition identified above with reference to FIGS. 1 and 2, may fail because they are used with different implementations of circuitry having different clock skew. In the prior art, even if the ports are accessed at the same time, there is no way to be sure that the above conditions are tested in normal operation because of clock skew. In other words, the prior art has not capability to reproduce and test for clock skew. For example, if the memory is designed and tested under a specific clock skew it may pass. Subsequently, the same memory used in a different application with a different clock skew may fail.

Therefore, there is a need for systems and method for testing multiple port memory devices that effectively test the most stressful conditions and accounts for clock skew.

SUMMARY OF THE INVENTION

The present invention overcomes the deficiencies and limitations of the prior art with a unique test circuit for multiple port memory devices. The multiple-port memory device preferably comprises a first and second control logic having test circuitry, a X-decoder, a combined memory array, a first input/output circuit, a second input/output circuit. The first and second control logic are preferably adapted to receive both the clock signal and a test signal. The first and second control logic include a clock control circuit that produces a clock signal (CCLK) that is used by other portions of the first and second control logic to assert the word lines. The clock control circuit also produces a control signal (EQ) that is used to control pre-charging transistor that form the first and second input/output circuits. The clock control circuit is particularly advantageous because it uses the test signal as an alternate control in producing the EQ signal. Thus, based on assertion of the test signal, the user may activate the pre-charge circuits as desired for testing. Therefore, the present invention provides for direct control of portions of the memory array to allow the memory array to be tested under the most stressful conditions.

These and other features and advantages of the present invention may be better understood by considering the following detailed description of a preferred embodiment of the invention. In the course of this description, reference will frequently be made to the attached drawings.

DETAILED DESCRIPTION OF THE PREFERRED EMBODIMENTS

While the present invention is described in the context of a dual port memory device, those skilled in the art will recognize that the present invention is applicable to a memory device having any number of ports greater than two, and may be used and integrated with other circuitry as a single integrated circuit. The present invention is described here in the context of dual port memory for convenience and ease of understanding.

Figure 4:
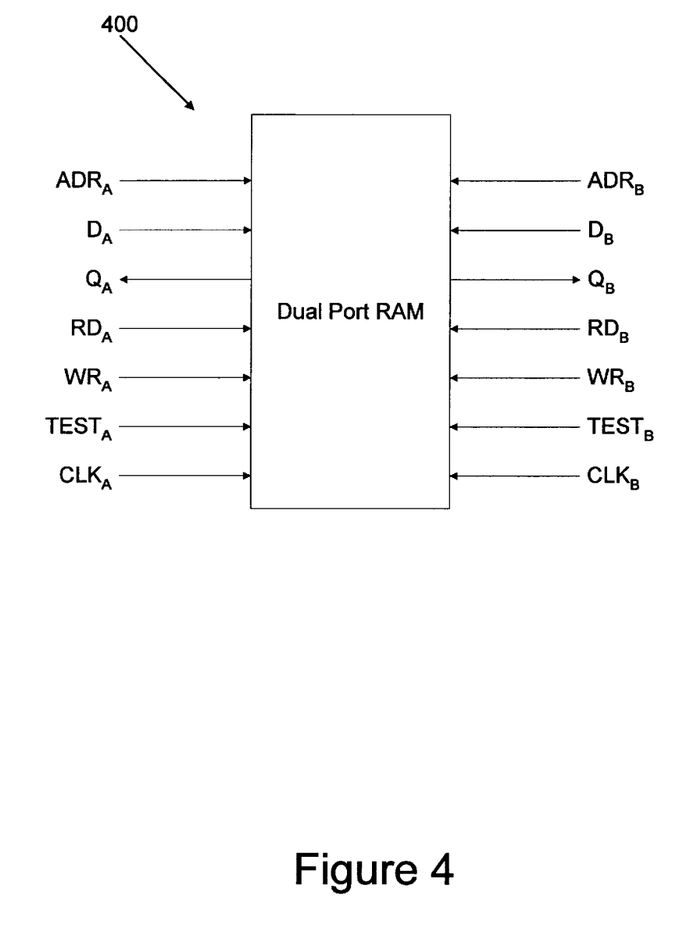
FIG. 4 is a high-level block diagram of a preferred embodiment of the multiple port memory unit the present invention.

Referring now to FIG. 4, a high-level block diagram of a preferred embodiment of the dual port memory unit 400 of the present invention is shown. The dual port memory 400 preferably has a first port, port A, and a second port, port B. For each port, the dual port memory 400 provides inputs and outputs of a conventional type such as an address input, a data input, a data output, a read control input, a write control input, and a clock input. The present invention advantageously also provides a test input for each port, $TEST_A$, $TEST_B$. The test input provides for static selection of a word line and at the same time the present invention enables static pre-charging of the bit lines to dump full read current on the selected row of cells. Use of this test control signal along with a conventional access to the other word lines provides for testing the most stressful cases that the memory unit 400 will encounter. While the present invention presents this concept in the dual port memory context, those skilled in the art will recognize that in the multiple port context, where more than two ports are present, the additional control circuitry can provide for static activation of the pre-charge circuits for the unused ports during test mode or even groups of pre-charge circuits not in use during test mode, in addition to the activation of the pre-charge circuit needed for the memory access operation.

Figure 5:
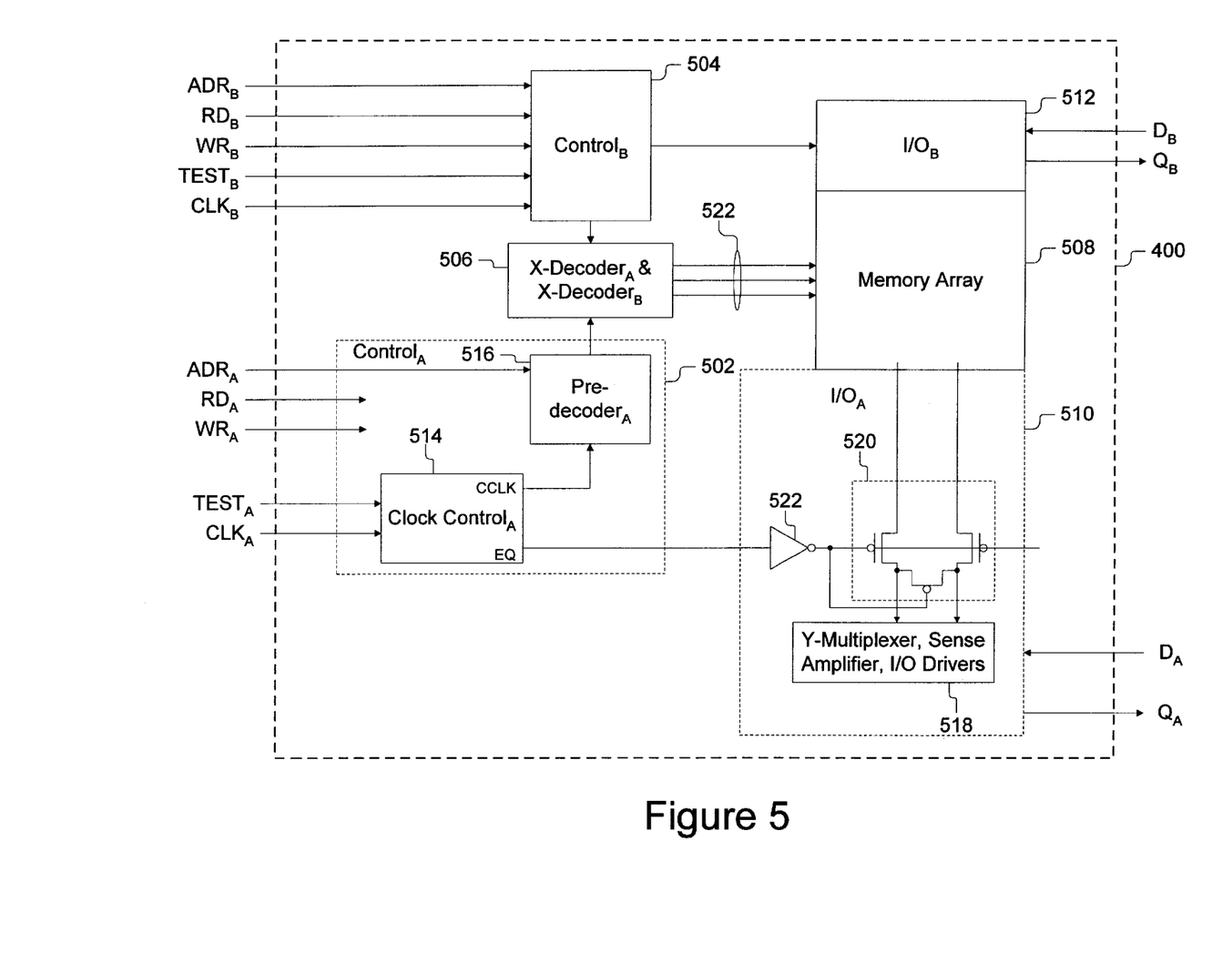
FIG. 5 is a block diagram of a preferred embodiment of the multiple-port memory unit with selected portions relating to testing shown in expansion.

Referring now to FIG. 5, a block diagram of a preferred embodiment of the dual port memory unit 400 with selected portions relating to testing is shown in more detail. The dual port memory unit 400 preferably comprises first control logic 502, second control logic 504, an X-decoder 506, a memory array 508, a first input/output circuit 510, and a second input/output circuit 512. The present invention includes a number of components in addition to those just identified. Each of these components is conventional in certain respects. For example, the dual port memory unit 400 includes a reference column (not shown) conventionally used with memory arrays and in memory cores. Moreover, the present invention is not discussed with regard to a particular, word or array size since the number of input bits and output bits could be any number adapted to the needs of the user.

As best shown in FIG. 5, the first control logic 502 includes a pre-decoder 516, a clock control circuit 514 and other control circuitry (not shown). The first control logic 502 is preferably adapted to receive both the clock signal ($CLK_A$) and a test signal ($TEST_A$). These signals are provided to the clock control circuit 514 and will be described in more detail below with reference to FIG. 6A and 7A below. In a primary aspect of the present invention, the clock control circuit 514 produces a control signal (EQ) that is used to control pre-charging transistors 520 (only some of which are shown) that are part of the input/output circuit 510. The clock control circuit 514 is particularly advantageous because it uses the test signal as an alternate control in generating or asserting the EQ signal and selecting the word line. Thus, based on assertion of the test signal (TEST$_A$), the user may activate the pre-charge circuits 520 and activate pre-decoder$_A$ 516 and X-decoder$_A$ 506 to select a word line as desired for testing. Therefore, the present invention provides for direct control of portions of the memory array 400 to allow the memory array 400 to be tested under the most stressful conditions, and allows the user to test for conditions that are clock skew independent.

Since the present invention is described in the context of a dual port memory, it will be apparent that the test signal allows the user to activate the pre-charging for the lines that are not being tested. In other words, when the first port (port A) is being read, assertion of the test line allows activation of the pre-charging of the bit lines for the second port (port B), thereby allowing testing of the dual port memory 400 under the worst conditions. Those skilled in the art will recognize that the present invention is applicable to other memory devices having n ports, and when used in such devices, the invention permits the assertion or activation of pre-charging for the n–1 bit-lines not in use and n–1 word lines as well. For example, if used in a three-port device, the present invention would provide for activation of the bit lines for the two non–selected (n–1) ports (all but the one being tested).

As noted above, the first control logic 502 also includes other control logic (not shown) for processing the control and address signals that dictate storage in and retrieval of data from the memory array 508. The first control logic 502 is formed from conventional digital logic devices formed as part of an integrated circuit, and is similar to conventional types of control logic for memory cores and arrays. The first control logic 502 works with the pre-decoder 516 to generate the signals sent to the X-decoder 506. One noted difference is the first control logic 502 includes a novel clock control unit 514 that receives and uses a test signal for static testing of the memory array. The clock control circuit 514 also produces another clock signal (CCLK) that is used by the pre-decoder 516 along with other signals to assert and select the word lines 522. In particular, the pre-decoder 516 receives address signals, write control signals, and read control signals, and uses them in the generation of control signals sent from the pre-decoder 516 to the X-decoder 506 in a conventional manner.

Figure 6A:
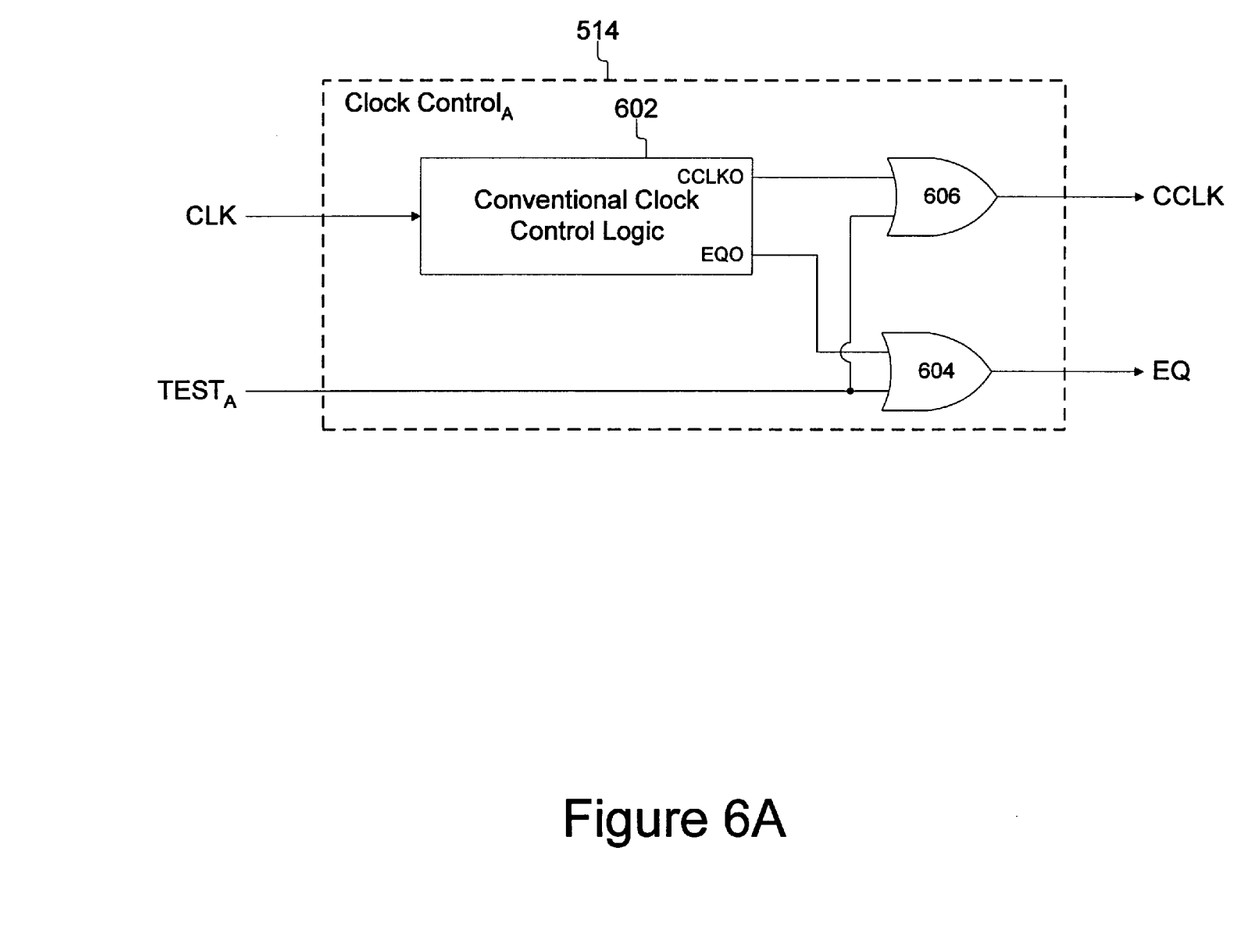
FIG. 6A is a block diagram of a first embodiment of the clock control circuit of the present invention.
Figure 7A:
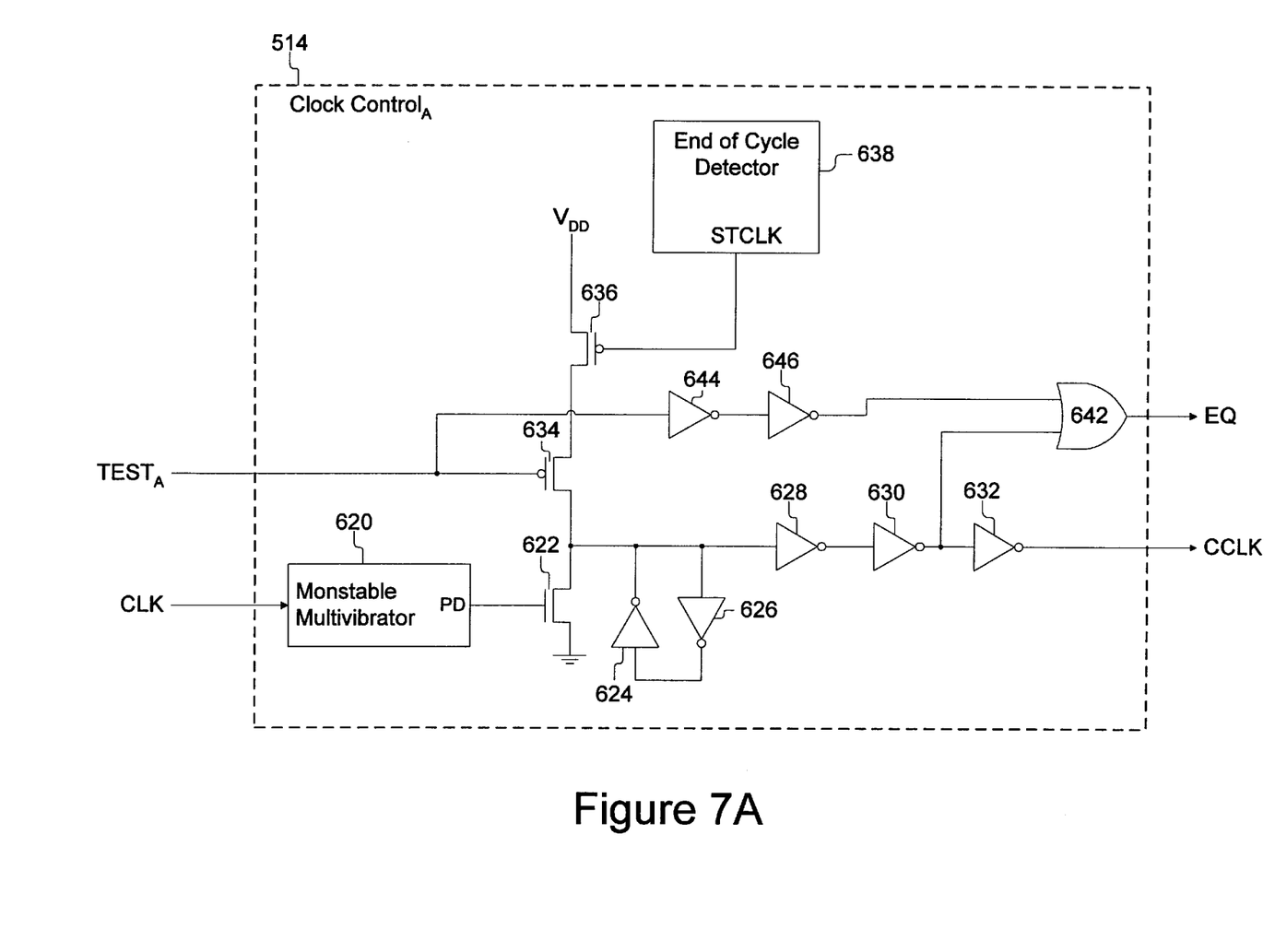
FIG. 7A is a block diagram of a second and preferred embodiment of the clock control circuit of the present invention.

While only the first control logic 502 is expanded in FIG. 5 to show some of its constituent components in more detail, those skilled in the art will recognize that the second control logic 504 provides a similar functionality but uses the read, write, address, test and clock signals corresponding to the second port, port B, and works in conjunction with the second input output circuit 512. Thus, the first and second embodiments for the clock control circuit 514 described below with reference to FIGS. 6 and 7 could also be used in the second control logic 504.

The X-decoder 506 is coupled to the first control logic 502 to receive addressing signals from the first control logic 502. The X-decoder 506 receives the address signals, identifies which words of the array 508 are to be asserted and generates a signal for each word to be asserted and outputs the signal. The X-decoder 506 has a conventional design as will be understood to those skilled in the art. The X-decoder 506 provides this function for both ports and thus receives control signals from both the first control logic 502 and the second control logic 504. The X-decoder 506 includes word-line drivers (not shown). The word-line drivers are preferably groups of buffer drivers that receive signals from the X-decoder 506 and assert and amplify the signals over word lines 522 and portions of the array 508 so that particular words are accessed. Thus, signals provided in the horizontal direction, on lines 522, provide the input from the X-decoder 506 to the combined memory array 508.

The present invention is described here as including a dual port memory array 508. As noted above, the present invention could be used with a variety of other types of memory arrays including those having more than two ports. The memory array 508 preferably includes a plurality of memory cells grouped for access on a word basis. The individual memory cells have a conventional design, however, are enabled on a word basis. The word size may be any size from 1 to n. Those skilled in the art will realize that the memory array 508 may organize the particular cells in any number of ways. The aspect ratio of the memory array 508 may be controlled by grouping cells in a row by groups of 4, 8, 16, 32 or other powers of 2.

Below and above the memory array 508, the present invention positions a first input/output (I/O) circuit 510, and a second input/output circuit 512. Each of the input/output (I/O) circuit 510, 512, includes a Y-multiplexer, pre-charging circuits, and sense amplifiers 518, 520. As partially shown, the first input/output (I/O) circuit 510 (also for the second input/output circuit 512 although not shown) includes pre-charging transistors 520 for pre-charging the bit lines of the memory array 508. The first input/output (I/O) circuit 510, and a second input/output circuit 512 have a conventional design as will be understood to those skilled in the art. The notable difference from the prior art is that the control signal received for the pre-charging the transistors 520 is modified from that of the prior art. The Y-multiplexer and pre-charging circuits 518, 520 (only partially shown) are conventional types, with the pre-charging circuit 520 charging the bit lines of the memory array 508 for reading and writing, and the Y-multiplexer providing one of multiple inputs to the sense amplifiers 518. The Y-multiplexer 518 and pre-charging circuit 520 are coupled to the cells of the array 508 by lines extending generally vertically over the length of the memory array 508. The sense amplifiers 518 are positioned below the Y-multiplexer 518 and pre-charging circuit 520. The sense amplifiers, Y-multiplexer and pre-charging circuit are not shown for the second input/output circuit 512, but would be the mirror image of the first input/output circuit 510 and positioned above memory array 508. The sense amplifiers 518 generate data to be output from the array 508. This data is passed for transmission out of the memory unit 400. The input/output circuit 510, 512 is also the source of data for storage in the array 508 from outside the memory unit 400.

Referring now to FIG. 6A, a block diagram of a first embodiment of the clock control circuit 514 of the present invention is shown. The first embodiment of the clock control circuit 514 preferably comprises conventional clock control logic 602, a first OR-gate 604 and a second OR-gate 606. The conventional clock control logic 602 is similar to that used in the prior art for clock control logic for a dual port memory device. The conventional clock control logic 602 produces a CCLKO signal used to generate control signals to the X-decoder 506 and an EQO signal used to control the pre-charging of the bit lines. The present invention further provides the first OR-gate 604 to provide independent control of assertion of the EQ signal, and thus, independent control of activation of the pre-charging transistors 520. The second OR-gate 606 also independently controls and asserts the CCLK signal in response to the TEST signal. Both the first and second OR-gates 604, 606 have an input coupled to receive the TEST signal. The other input of the second OR-gate 604 is coupled to an output of the conventional clock control logic 602 to receive the EQO signal. The output of the first OR-gate 604 provides the EQ signal coupled to the pre-charging transistors 520 by inverter 522. The other input for the second OR-gate 606 is coupled to the CCLK output of the conventional clock control logic 602 to receive the CCLKO signal. The output of the second OR-gate 606 in turn provides the CCLK signal that is provided to the pre-decoder 516.

Figure 6B:
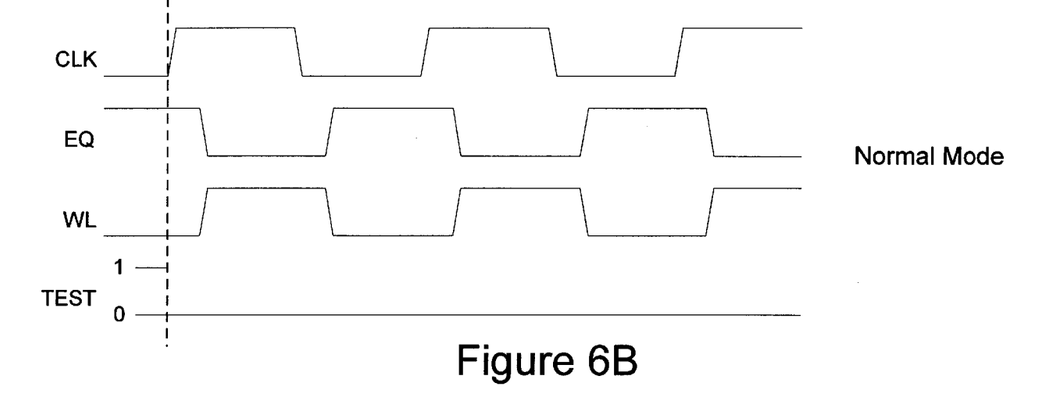
FIG. 6B is a timing diagram illustrating signals from the first embodiment of the clock control circuit of the present invention during normal operation or mode.
Figure 6C:
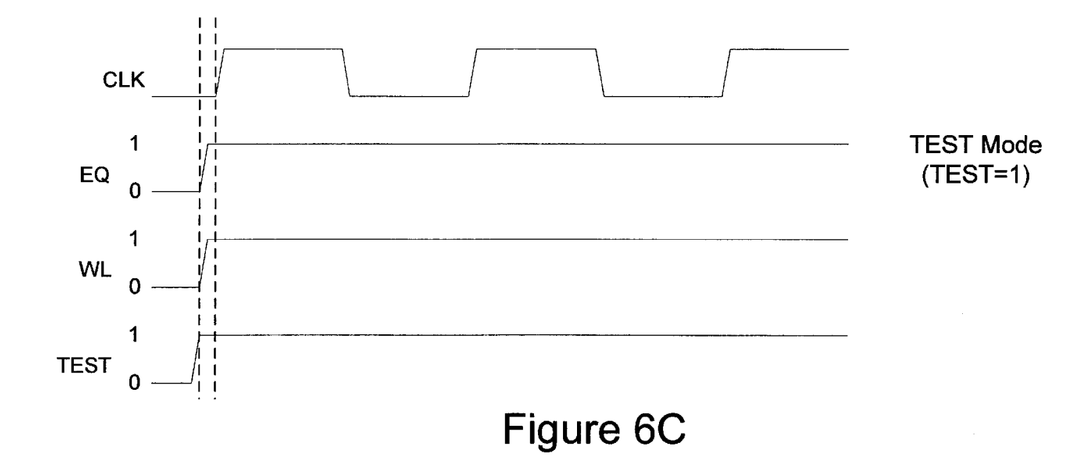
FIG. 6C is a timing diagram illustrating signals from the first embodiment of the clock control circuit e present invention during test mode.

The operation of the clock control circuit 514 of the present invention is best shown by the timing diagrams in FIGS. 6B and 6C. FIG. 6B is a timing diagram illustrating signals from the embodiment of the clock control circuit 514 during normal operation or mode. In this mode, the clock control circuit 514 operates in a conventional manner and asserts the CCLK signal to select word lines, and asserts the EQ signal for pre-charging the bit lines so that data can be written to and read from memory array 508. In the normal mode, the TEST signal is low and has no effect on the operation of the clock control circuit 514. In contrast, FIG. 6C is a timing diagram illustrating signals from the clock control circuit 514 during test mode. In test mode, the TEST signal at some point in time transitions from low to high (asserted). Once this occurs, the CCLK signal and the EQ signal are held in a high state. Thus, the word lines are asserted and the bit lines are pre-charged. This allows testing of the memory cells 22 in the most stressful conditions as has been described above. Since the TEST signal is coupled to the first and second OR-gates 604, 606, it provides direct and independent control of the CCLK signal and the EQ signal generated by the clock control circuit 514.

While the present invention has been shown and described as being part of the clock control circuit 514, those skilled in the art will recognize that it could be formed as part of the pre-charging circuit 520.

Referring now to FIG. 7A, a block diagram of a second, more detailed implementation of the clock control circuit 514 of the present invention is shown. The more detailed implementation of the clock control circuit 514 preferably comprises a monostable multi-vibrator 620, a plurality of transistors 622, 634, 636, a plurality of inverters 624, 626, 628, 630, 632, 644, 646, an end-of-cycle detector 638, and an OR-gate 642. The clock control circuit 514 provides a first portion directed to generation of the CCLK signal and a second portion directed to generation of the EQ signal.

The first portion includes the monostable multivibrator 620, the transistors 622, 634, 636, and the inverters 624, 626, 628, 630, and 632. The input of the monostable multivibrator or one shot 620 is coupled to a signal line to receive the clock signal (CLK). In response to a rising edge on the clock signal the monostable multivibrator 620 generates a pulse having a fixed width at its output as the PD signal. The output of the monostable multivibrator 620 is coupled to the gate of transistor 622. This selectively activates or closes transistor 622 in response to the PD signal. The transistor 622 has its source coupled to ground and its drain coupled to the source of transistor 634. The drain of transistor 622 is coupled by transistors 634 and 636 to the voltage, $V_{DD}$. The drain of transistor 622 is also coupled to input of inverters 626 and 628. Inverter 626 has its output coupled to the input of inverter 624. The output of inverter 624 is also coupled to the drain of transistor 622. Together inverters 624 and 626 form a latch to store the signal at the drain of the first transistor 622. The remaining inverters 628, 630 and 632 are coupled in series with the last inverter 632 in the series providing the CCLK signal at its output.

The second portion of the clock control circuit 514 includes the transistors 634, 636, the inverters 644, 646, the end-of-cycle detector 638, and the OR-Gate 642. The inverter 644 has an input coupled to receive the TEST signal and an output coupled to the input of the inverter 646. The output of inverter 646 is coupled to an input of the OR gate 642 similar to the first embodiment described above with reference to FIG. 6A, in particular OR gate 604. The other input of the OR gate 642 is coupled to the output of the inverter 630 to receive an inverted version of the CCLK signal. The output of the OR gate 642 provides the EQ signal. Thus, the test signal can be used to assert the EQ signal as desired.

The gate of transistor 634 is also coupled to receive the TEST signal. Thus, the test signal controls the operation of transistor 634 and affects the CCLK signal directly. In particular, once the TEST signal is asserted, the transistor 634 is de-activated or opened, thus preventing the node at the drain of transistor 622 from being asserted or pulled high, and thus holding the CCLK signal in a high state since it is inverted with respect to the drain of transistor 622. Essentially, the transistor 634 and its coupling to the TEST signal blocks transitions in the clock signal by not letting the clock cycle stop. This implementation is particularly advantageous because it introduces much less delay in the generation of the CCLK and EQ signals. Especially for high-speed designs, this is critical and minimizes the operational delay introduced by addition of the test circuitry.

The other transistor 636 operates in a similar manner to transistor 634; however, the gate of transistor 636 is coupled to receive the STCLK signal from the End of Cycle detector 638. Thus, the other transistor 636 also prevents the node at the drain of transistor 622 from being asserted or pulled high until the STCLK signal is at a low state. The End of Cycle detector 638 is driven by the reference column (not shown) consistent with normal operation of dual port memory 400. The end-of-cycle detector 638 provides an STCLK output that indicates the end of a memory cycle. The End of Cycle detector 638 generates a signal that is used to produce the falling edge of the CCLK signal, the EQ signal and the assertion of the word lines in accordance with normal operation of the array 508.

Figure 7B:
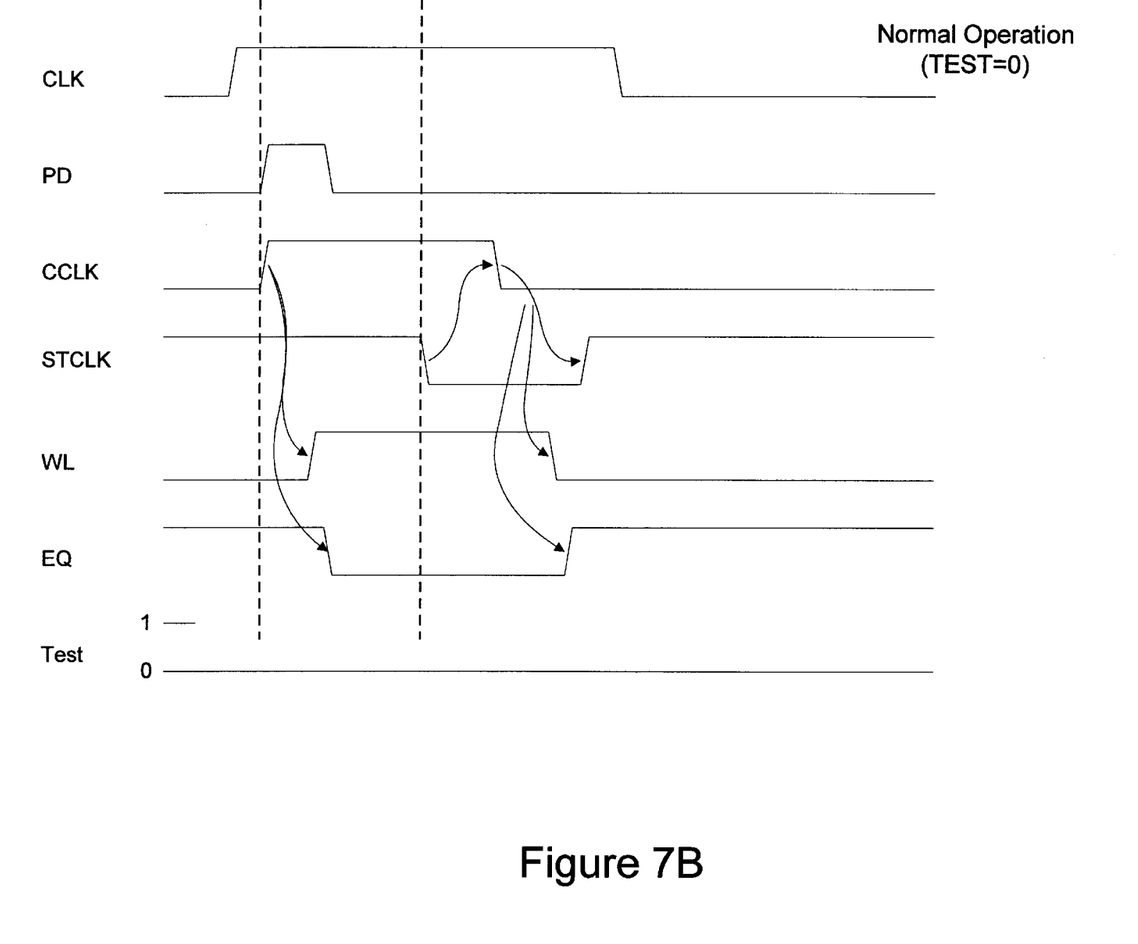
FIG. 7B is a timing diagram illustrating signals from the second embodiment of the clock control circuit the present invention during normal operation.
Figure 7C:
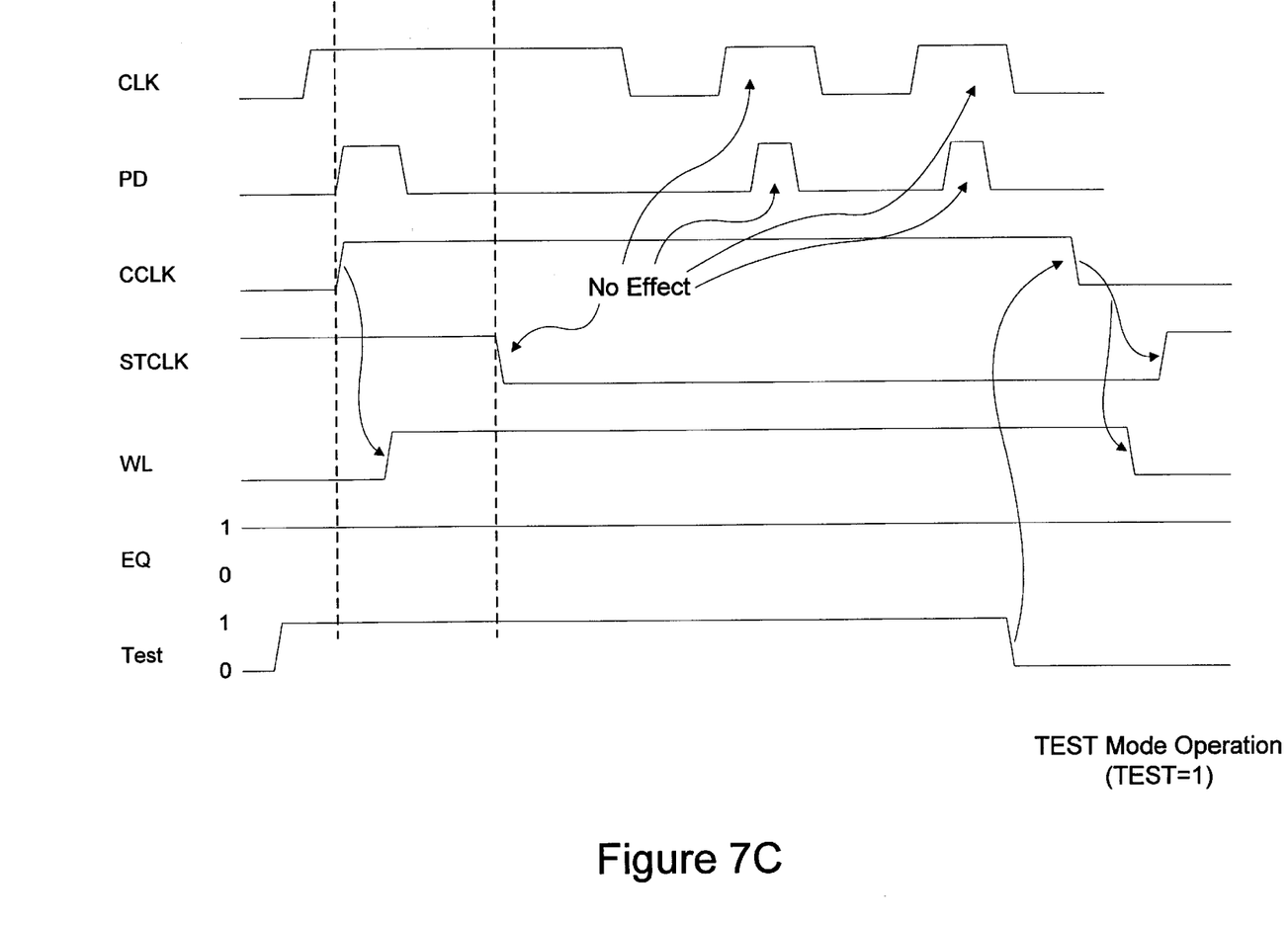
FIG. 7C is a timing diagram illustrating signals from the second embodiment of the clock control circuit of the present invention during testing operation.

Referring now to FIGS. 7B and 7C, the importance of the present invention can more clearly be seen. FIG. 7B is a timing diagram illustrating signals from the second embodiment of the clock control circuit 514 of the present invention during normal operation, and FIG. 7C shows the same signals during assertion of the TEST signal. As shown in FIG. 7B, the TEST signal remains low and unasserted, and thus, there is no impact on the EQ signal. More specifically, the EQ signal is asserted low in response to the CCLK signal for pre-charging the lines as necessary during the read or write cycle. The word lines are also selected and driven at a time corresponding to when the EQ signal is de-asserted.

In contrast, FIG. 7C shows the effects of assertion of the TEST signal. For the case shown in FIG. 7C, the EQ signal is high before the transition in the TEST signal. Once the TEST signal transitions to high, this prevents the EQ signal from changing to low state, as would be the case in normal operation. In particular, as shown in FIG. 7C, the EQ signal remains high even though the CCLK has changes to a high state. Furthermore, the EQ signal remains asserted regardless of the signals asserted by the other portions of the clock control circuit 514 during the normal read or write cycle. For example, the falling edge of the STCLK signal and other rising edges on the PD signal or the CLK signal have not effect on both the CCLK signal and the EQ signal. Only after the TEST signal returns to low do the CCLK signal and the EQ signal again become responsive to changes in the STCLK, CLK and PD signals. Thus, the present invention provides for static control of the pre-charging of the bit lines and word line assertion. The present invention is particularly advantageous because it provides for independent control necessary for testing the most stressful conditions that the dual port memory 400 may encounter while providing such control with minimum circuitry and re-design. Specifically, the present invention is advantageous because with the addition of changes only to the clock control circuit 514, independent control for testing is provided.

Therefore, it is unnecessary to change any portions of the I/O circuit 510, 512, memory array 508 and decoder 506.

Figure 8A:
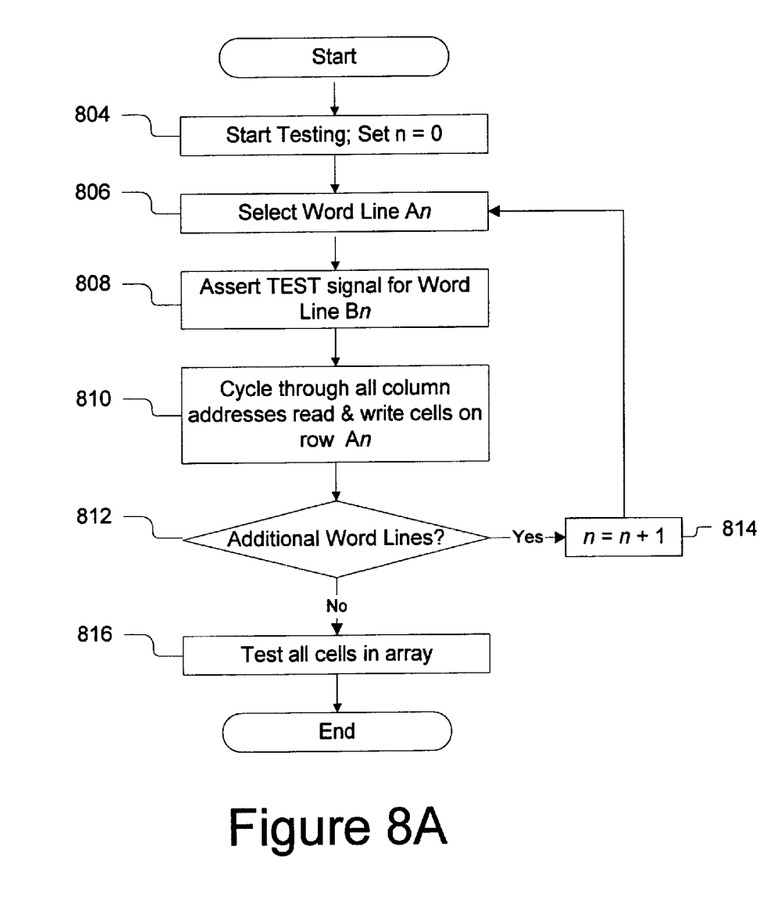
FIGS. 8A and 8B are flow charts of method for testing a memory device including the clock control circuit of the present invention.

Referring now to FIG. 8A, a preferred method for testing a circuit that includes the present invention will be described. In particular, the method assumes that the circuit is a memory array that includes the test circuitry of the present invention. The method begins in step 804, by starting testing and sets a variable for the word line, n, to zero. Then in step 806 the method selects the word line An. For example, for the first pass through steps 806, the method would select word line 0 for port A, A0. Next in step 808, the method asserts the TEST signal on port B for word line n. This is the set up for testing. Again for the first pass through step 808, the method would assert the TEST signal on the B port for word line n. Then in step 810, the method cycles through all the column addresses while performing read and write operations to cells on word line A0 and reads and writes cell on row An. Next, in step 812, the method determines whether there are additional word lines in the array. If there are, the method continues in step 814 to increment n to be n+1, after which the method returns to steps 806 to resume testing. If on the other hand, there are no more word lines, the method continues in step 816. Since each cell has now undergone testing for adverse conditions, the method performs normal testing to see if any of the cells are defective because of the additional current provided by asserting the test signal while selecting a word line. Those skilled in the art will recognize that the same test could be performed by reversing the roles for port A and B and their respective test signal $Test_A$ and $Test_B$.

Figure 8B:
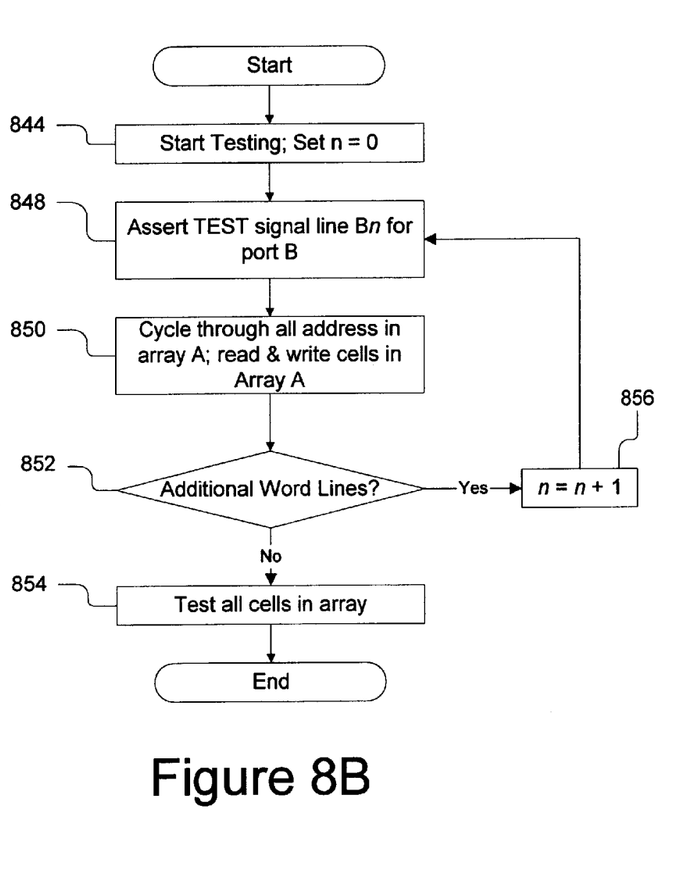

Referring now to FIG. 8B, another method for testing a circuit that includes the present invention will be described. The method begins in step 844 by testing and setting a variable for the word line, n, to zero. Next in step 848, the method asserts the TEST signal line Bn on port B. Then in step 850, the method cycles through all addresses for in array A, and reads and writes cells in array A. Next, in step 812, the method determines whether there are additional word lines in the port A portion of the array. If there are, the method continues in step 856 to increment n to be n+1, after which the method returns to step 848 to resume testing. If on the other hand, there are no more word lines, the method continues in step 854. Since each cell has now undergone testing for adverse conditions, the method performs normal testing to see if any of the cells are defective because of the additional current provided by asserting the test signal while selecting a word line.

It is to be understood that the specific mechanisms and techniques that have been described are merely illustrative of one application of the principles of the invention. Numerous additional modifications may be made to the apparatus described above without departing from the true spirit of the invention.

What is claimed is:

1. In a memory device having multiple ports, a circuit for testing the operation of said memory device, the circuit providing for independent control of a pre-chargeing circuit and a word line selection circuit, the circuit for testing having a first input, a second input, a first output and a second output, the first input coupled to receive a clock signal, a second input coupled to receive a test signal, the first output of the circuit for testing coupled to control a pre-charging circuit and the second output of the circuit for testing coupled to the word line selection circuit.

2. The memory device of claim 1, wherein the circuit for testing is part of a control logic for the memory device.

3. The memory device of claim 1, wherein the circuit for testing is part of a clock control circuit for the memory device.

4. The memory device of claim 1, wherein the circuit for testing is part of a pre-charging circuit for the memory device.

5. The memory device of claim 1, wherein the circuit for testing is part of the word line selection circuit for the memory device.

6. The memory device of claim 1, wherein the memory device has a plurality of such testing circuits.

7. The memory device of claim 2, wherein the circuit for testing includes a first OR gate, and a second OR gate, the first OR gate having a first input, a second input and an output, the first input of the first OR gate coupled to receive the test signal, the second input of the first OR gate coupled to an output of the clock control circuit and the output of the OR gate controlling the pre-charging circuit, the second OR gate having a first input, a second input and an output, the first input of the second OR gate coupled to receive the test signal, the second input of the second OR gate coupled to an output of the clock control circuit and the output of the second OR gate use to control the selection of word lines.

8. The memory device of claim 1, wherein the circuit for testing provides a first signal for controlling pre-charging circuits of the clocked memory device, and a second signal for selecting the word lines of the clocked memory device.

9. The memory device of claim 8, wherein the circuit for testing does not allow transitions in the second signal for selecting the word lines of the clocked memory device when a test signal is received.

10. The memory device of claim 8, wherein the circuit for testing does not allow transitions in the first signal for controlling p re-charging circuits of the clocked memory device when a test signal is received.

11. A method for testing a memory device having test circuitry for independently pre-charging bit lines and selecting word lines, the method comprising the steps of:

selecting a word line for a first port;

asserting a test signal on a second port;

cycling through column addresses for an array having memory cells; and performing testing on the cells of the array.

12. The method of claim 11, further comprising the steps of:

determining whether there are additional word lines in the array; and repeating the steps of selecting, asserting, cycling for a next word line.

13. The method of claim 11, further comprising the steps of repeating the steps of selecting, asserting, cycling for each word line in the array.

14. The method of claim 11, further comprising the steps of:

setting up for testing; and wherein the step of selecting a word line is performed for the first port for word line n; and the step of asserting is performed for the second port for word line n.

15. The method of claim 11, wherein the memory device has a plurality of ports.

16. The method of claim 15, wherein the memory device has n ports and n is an integer greater than 2.

17. In a memory device having multiple ports, said memory device including circuitry for reading and writing cells in said memory device by selecting word lines and pre-charging bit lines according to a normal process and end of cycle, a test circuit for testing the operation of said memory device, the circuit preventing an end of cycle and thereby providing independent control of pre-charging and word line selection, the test circuit having a first input, a second input, a first output, and a second output, the first input coupled to receive a clock signal, a second input coupled to receive a test signal, and the first output of the test circuit coupled to control pre-charging and the second output of the test circuit coupled to control word line selection.

18. The memory device of claim 17, wherein the test circuit includes a transistor having a gate, a source and a drain, the gate coupled to receive the test signal, and the source and drain of the transistor coupled to prevent an end of cycle signal from being asserted.

19. The memory device of claim 17, wherein the test circuit includes gating logic having a first input, a second input and an output, the first input of the gating logic coupled to receive the test signal, the second input of the gating logic coupled to receive a clock signal, and the output of the gating logic used as a clock for word line selection.

* * * * *

UNITED STATES PATENT AND TRADEMARK OFFICE
CERTIFICATE OF CORRECTION

PATENT NO.    : 6,269,036 B1
DATED         : July 31, 2001
INVENTOR(S)   : Alexander Shubat Page 1 of 1

It is certified that error appears in the above-identified patent and that said Letters Patent is hereby corrected as shown below:

<u>Title page,</u>
Line 12, ABSTRACT, please delete "precharge" and replace with -- pre-charge. --

<u>Column 10, claim 1,</u>
Line 8, please replace "pre-chargeing" with -- pre-charging --.

<u>Column 10, claim 10,</u>
Line 12, please replace "p recharging" with -- pre-charging --.

Signed and Sealed this

Twenty-sixth Day of February, 2002

*Attest:*

JAMES E. ROGAN
*Attesting Officer*     *Director of the United States Patent and Trademark Office*